(12) United States Patent
Honda et al.

(10) Patent No.: US 11,309,842 B2
(45) Date of Patent: Apr. 19, 2022

(54) POWER AMPLIFIER CIRCUIT

(71) Applicant: Murata Manufacturing Co., Ltd., Kyoto (JP)

(72) Inventors: Yuri Honda, Kyoto (JP); Hisanori Namie, Kyoto (JP); Hideyuki Satou, Kyoto (JP); Yoshiaki Sukemori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 17/017,184

(22) Filed: Sep. 10, 2020

(65) Prior Publication Data
US 2021/0075369 A1 Mar. 11, 2021

(30) Foreign Application Priority Data
Sep. 11, 2019 (JP) .............................. JP2019-165750

(51) Int. Cl.
*H03F 1/02* (2006.01)
*H03F 3/21* (2006.01)
*H03F 1/56* (2006.01)

(52) U.S. Cl.
CPC ............ *H03F 1/0205* (2013.01); *H03F 1/56* (2013.01); *H03F 3/211* (2013.01); *H03F 2200/222* (2013.01); *H03F 2200/387* (2013.01)

(58) Field of Classification Search
CPC .......... H03F 1/0205; H03F 1/56; H03F 3/211; H03F 2200/222; H03F 2200/387

USPC .......................................................... 330/295
See application file for complete search history.

(56) References Cited

U.S. PATENT DOCUMENTS

2013/0190036 A1 7/2013 Zhao et al.
2014/0167853 A1 6/2014 Haruna et al.

FOREIGN PATENT DOCUMENTS

| CN | 102694520 B | * | 6/2016 | ............... H03F 3/19 |
| JP | 2014-121071 A | | 6/2014 | |
| KR | 20160103335 A | * | 9/2016 | .............. H03F 3/211 |
| WO | WO-2012157645 A1 | * | 11/2012 | .............. H03F 1/565 |
| WO | WO-2021141464 A1 | * | 7/2021 | ............... H03F 3/19 |

* cited by examiner

*Primary Examiner* — Hafizur Rahman
(74) *Attorney, Agent, or Firm* — Pearne & Gordon LLP

(57) ABSTRACT

A power amplifier circuit includes a first path and a second path between an input terminal and an output terminal, a first amplifier located in the first path operative in a first mode, a second amplifier located in the second path operative in a second mode, a first matching circuit between the first amplifier and the output terminal in the first path, a first capacitor having a first end connected to the output terminal side of the first matching circuit, and a second end, a first inductor having a first end connected to the second end of the first capacitor and a second end grounded, and a short-circuit switch connected in parallel with the first inductor. The short-circuit switch short-circuits the first and second ends of the first inductor in the first mode and is placed in an open-circuit position in the second mode.

20 Claims, 17 Drawing Sheets

POWER AMPLIFIER CIRCUIT

This application claims priority from Japanese Patent Application No. 2019-165750 filed on Sep. 11, 2019. The content of this application is incorporated herein by reference in its entirety.

BACKGROUND

The present disclosure relates to a power amplifier circuit. Wireless communication terminal devices include power amplifier circuits that may be required to switch gains to change output levels in accordance with distances between base stations and the terminal devices. For example, a power amplifier circuit may be required to switch between amplification with a first gain that is relatively high (high gain) and amplification with a second gain that is relatively low (low gain). Accordingly, the power amplifier circuit may include two power amplification paths having different gains. For example, Japanese Unexamined Patent Application Publication No. 2014-121071 discloses a power amplifier circuit that has a path including two amplifiers and a path including a single amplifier.

Switching between amplification with a first gain that is relatively high (high gain) and amplification with a second gain that is relatively low (low gain) requires isolation to be ensured between two power amplification paths. To ensure isolation between the two power amplification paths, for example, in the path along which amplification with the second gain that is relatively low is carried out, the impedance is decreased by using a matching circuit and is then increased by using another matching circuit, and output is obtained, in some cases. In this way, impedance conversion is performed a plurality of times, causing power loss. In a power amplifier circuit having two power amplification paths, the power loss can be reduced while ensuring isolation between the two power amplification paths.

BRIEF SUMMARY

The present disclosure provides a power amplifier circuit with reduced power loss and ensured isolation between two power amplification paths therein.

According to embodiments of the present disclosure, a power amplifier circuit includes an input terminal, an output terminal, a first path between the input terminal and the output terminal, a second path between the input terminal and the output terminal, the second path being in parallel with the first path, a first amplifier in the first path, the first amplifier being rendered operative in a first mode, a second amplifier in the second path, the second amplifier being rendered operative in a second mode, a first matching circuit in the first path, the first matching circuit being located between the first amplifier and the output terminal, a first capacitor in the first path, the first capacitor having a first end and a second end, the first end of the first capacitor being connected to the output terminal side of the first matching circuit, a first inductor having a first end connected to the second end of the first capacitor and a second end grounded, and a short-circuit switch connected in parallel with the first inductor. The short-circuit switch is placed in a short-circuit position in the first mode to short-circuit the first end and the second end of the first inductor, and is placed in an open-circuit position in the second mode.

According to embodiments of the present disclosure, it is possible to provide a power amplifier circuit with reduced power loss and ensured isolation between two power amplification paths therein.

Other features, elements, characteristics and advantages of the present disclosure will become more apparent from the following detailed description of embodiments of the present disclosure with reference to the attached drawings.

DETAILED DESCRIPTION

The following describes power amplifier circuits according to embodiments of the present disclosure in detail with reference to the drawings. It should be noted that the present disclosure is not limited by the embodiments. Components in the embodiments include those that are replaceable and easily made by a person skilled in the art, or those that are substantially the same. The embodiments are illustrative, and components presented in different embodiments may be partially replaced or combined. Features common to a first embodiment will not be described in a second embodiment and the subsequent embodiment, and only the differences will be described. In particular, similar operational effects achieved with similar configurations will not be described again in the individual embodiments.

Prior to the description of the first embodiment, a comparative example will be described first to facilitate understanding of the first embodiment.

Comparative Example

Figure 1:
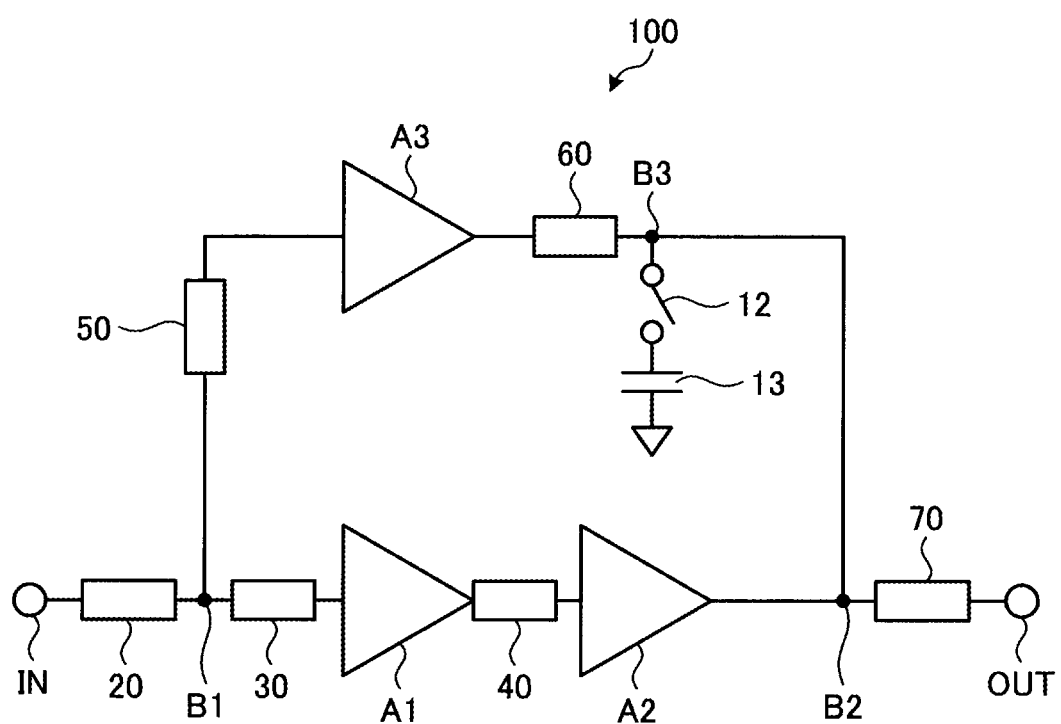
FIG. 1 illustrates a configuration of a power amplifier circuit of a comparative example.

FIG. 1 illustrates a configuration of a power amplifier circuit of a comparative example. A power amplifier circuit 100 of the comparative example includes amplifiers A1, A2, and A3, matching circuits 20, 30, 40, 50, 60, and 70, an input terminal IN, and an output terminal OUT.

In FIG. 1, the amplifiers A1 and A2 are connected between the input terminal IN and the output terminal OUT. The matching circuits 20 and 30 are connected between the input terminal IN and the amplifier A1. The matching circuit 40 is connected between the amplifier A1 and the amplifier A2. The matching circuit 70 is connected between the amplifier A2 and the output terminal OUT.

A node B1 between the matching circuit 20 and the matching circuit 30 is connected to an end of the matching circuit 50. The other end of the matching circuit 50 is connected to the amplifier A3. The output side of the amplifier A3 is connected to an end of the matching circuit 60. The other end of the matching circuit 60 is connected to a node B2 between the amplifier A2 and the matching circuit 70 via a node B3. The amplifier A3 is connected in parallel with the amplifiers A1 and A2 between the node B1 and the node B2.

The node B3 is connected to an end of a switch 12. The other end of the switch 12 is connected to an end of a capacitor 13. The other end of the capacitor 13 is connected to ground potential. Thus, the switch 12 and the capacitor 13 are connected in series between the node B3 and ground potential. The switch 12 remains in the off position while the amplifier A3 is turned on, and remains in the on position while the amplifiers A1 and A2 are turned on.

The capacitance value of the capacitor 13 is set to be sufficiently large for the transmission frequency band so that the reflection coefficient on a Smith chart which corresponds to the impedance when the switch 12 remains in the on position has a phase angle in the range from −90 degrees to +90 degrees. As a result, the circuit on the ground potential side relative to the switch 12 can appear to be open when the switch 12 remains in the on position.

The node B2 is the lowest impedance point in a path extending from the input terminal IN to the output terminal OUT via the amplifiers A1 and A2. A path including the amplifier A3 is connected to the lowest impedance portion in the path including the amplifiers A1 and A2. With this configuration, the capacitor 13 can block direct-current current from flowing to ground potential when the switch 12 remains in the on position. When the switch 12 remains in the on position, with the presence of the capacitor 13, a high-frequency signal of the power amplifier circuit 100 in the transmission frequency band is less likely to flow to the switch 12 side even if the impedance is low. As a result, the power loss of the entire circuit is reduced.

With the two power amplification paths, the power amplifier circuit 100 can perform an amplification operation with a first gain that is relatively high (high gain) and an amplification operation with a second gain that is relatively low (low gain). That is, with the power amplification path including the amplifiers A1 and A2, the power amplifier circuit 100 can perform an amplification operation with the first gain that is relatively high (high gain). With the power amplification path including the amplifier A3, the power amplifier circuit 100 can perform an amplification operation with the second gain that is relatively low (low gain).

Figure 2:
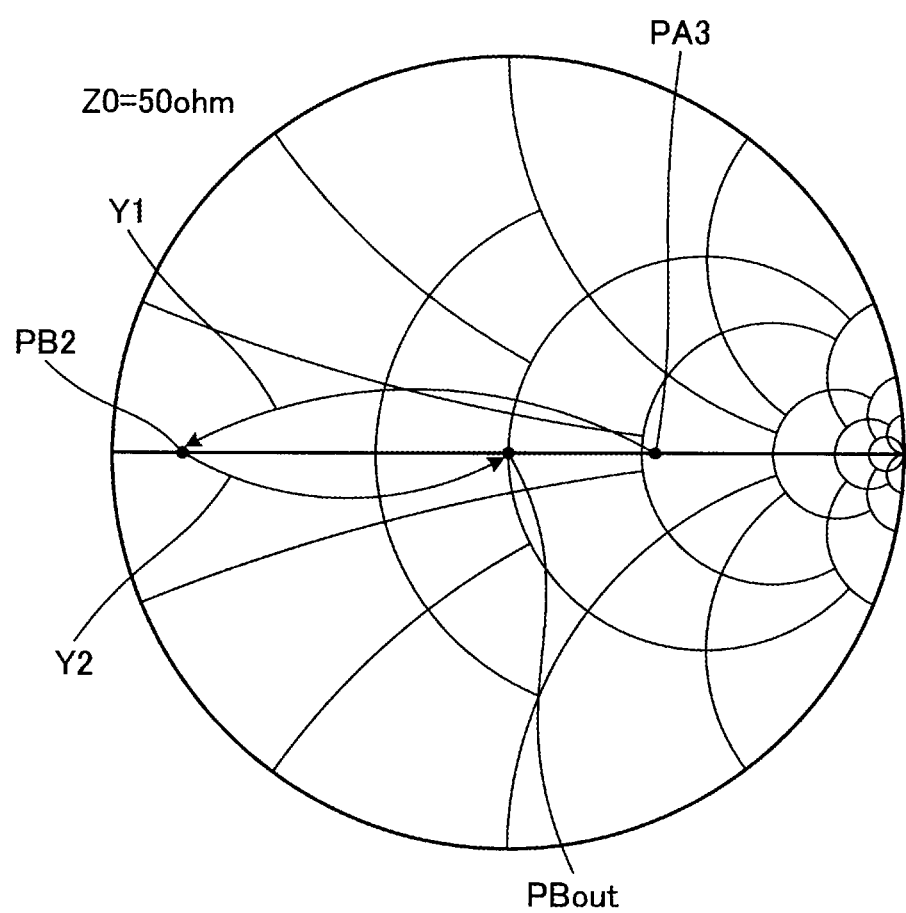
FIG. 2 is a Smith chart illustrating an example simulation result of a load characteristic of the power amplifier circuit illustrated in FIG. 1.

In FIG. 1, in the power amplification path including the amplifier A3, the impedance is decreased by using the matching circuit 60 and is then increased by using the matching circuit 70, and output is obtained. FIG. 2 is a Smith chart illustrating an example simulation result of a load characteristic of the power amplifier circuit 100 illustrated in FIG. 1. FIG. 2 illustrates a change in the impedance along the power amplification path including the amplifier A3. In the example illustrated in FIG. 2, the impedance on the output side of the amplifier A3 is represented by a point PA3, the impedance at the node B2 is represented by a point PB2, and the impedance at the output terminal OUT is represented by a point PBout. As indicated by an arrow Y1, the impedance is decreased along a path from the point PA3 to the point PB2. Thereafter, as indicated by an arrow Y2, the impedance is increased along a path from the point PB2 to the point PBout. In the power amplification path including the amplifier A3, accordingly, impedance conversion is performed a plurality of times. In this way, impedance conversion is performed a plurality of times, causing power loss. In a power amplifier circuit having two power amplification paths, the power loss can be reduced while ensuring isolation between the two power amplification paths.

First Embodiment

Circuit Configuration

Figure 3:
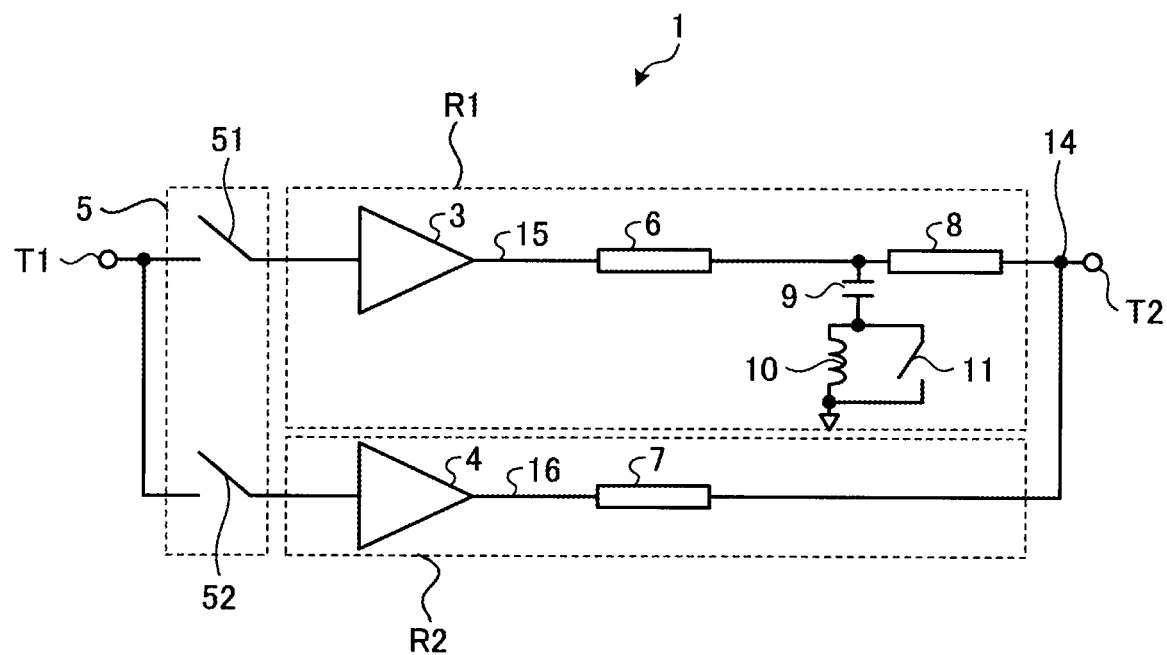
FIG. 3 illustrates a circuit configuration of a power amplifier circuit according to a first embodiment.

FIG. 3 illustrates a circuit configuration of a power amplifier circuit 1 according to the first embodiment. The power amplifier circuit 1 includes an input terminal T1, a switching unit 5, a first path R1, a second path R2, and an output terminal T2. The first path R1 and the second path R2 are in parallel with each other between the input terminal T1 and the output terminal T2. That is, the second path R2 is in parallel with the first path R1. In the power amplifier circuit 1, a path from the input terminal T1 is divided into the first path R1 and the second path R2 via the switching unit 5. An output end of the first path R1 and an output end of the second path R2 are connected to the output terminal T2. A node 14 to which the output end of the first path R1 and the output end of the second path R2 are connected is a node on the output terminal side of the first path R1 and is also a node on the output terminal side of the second path R2. The power amplifier circuit 1 amplifies a high-frequency input signal input to the input terminal T1 and outputs a high-frequency output signal from the output terminal T2. The power amplifier circuit 1 is capable of switching between an amplification operation with a first gain that is relatively high (high gain) by using the first path R1 and an amplification operation with a second gain that is relatively low (low gain) by using the second path R2. In the following, an operation mode for amplification with the first gain (high gain) is sometimes referred to as high-power mode. An operation mode for amplification with the second gain (low gain) is sometimes referred to as low-power mode. The first path R1 includes an amplifier 3. The second path R2 includes an amplifier 4.

The switching unit 5 includes a switch 51, which is a first switch, and a switch 52, which is a second switch. In the switching unit 5, while one of the switch 51 and the switch 52 is in the on position, the other switch is in the off position. In the illustrated example, the switch 51 is placed in the on position and the switch 52 is placed in the off position in the high-power mode, which is the first mode. In the low-power mode, which is the second mode, the switch 51 is placed in the off position and the switch 52 is placed in the on position. Accordingly, in the high-power mode, which is the first mode, the input terminal T1 and the first path R1 are electrically connected, and the input terminal T1 and the amplifier 3 are electrically connected. In the high-power mode, the input terminal T1 and the second path R2 are electrically disconnected. In the low-power mode, which is the second mode, the input terminal T1 and the second path R2 are electrically connected, and the input terminal T1 and the amplifier 4 are electrically connected. In the low-power mode, the input terminal T1 and the first path R1 are electrically disconnected.

The first path R1 includes the amplifier 3, a matching circuit 6, a matching circuit 8, a capacitor 9, an inductor 10, and a short-circuit switch 11. The output side of the amplifier 3 is connected to an end of the matching circuit 6. The other end of the matching circuit 6 is connected to an end of the matching circuit 8. The other end of the matching circuit 8 is connected to the output terminal T2.

The amplifier 3, which is a first amplifier, operates in the high-power mode, which is the first mode. The amplifier 3 does not operate in the low-power mode, which is the second mode. In the low-power mode, which is the second mode, no bias current is supplied to a transistor (not illustrated) in an output stage of the amplifier 3.

The matching circuit 6, which is a first matching circuit, functions as a low-pass filter, for example. The matching circuit 6 performs impedance conversion from about 2Ω to about 20Ω, for example. The matching circuit 8, which is a third matching circuit, performs impedance conversion from about 15Ω to about 50Ω, for example.

An end of the capacitor 9 is connected to the other end of the matching circuit 6. In the illustrated example, the one end of the capacitor 9 is connected between the matching circuit 6 and the matching circuit 8. The other end of the capacitor 9 is connected to an end of the inductor 10, which is a first inductor. The other end of the inductor 10 is electrically connected to reference potential. Examples of the reference potential include ground potential, to which the present disclosure is not limited.

The short-circuit switch 11 is connected in parallel with the inductor 10. The short-circuit switch 11 is placed in a short-circuit position (i.e., the on position) or an open circuit (i.e., the off position). In the high-power mode, which is the first mode, the short-circuit switch 11 is placed in the short-circuit position to short-circuit both ends of the inductor 10. In the low-power mode, which is the second mode, the short-circuit switch 11 is placed in the open-circuit position. Accordingly, both ends of the inductor 10 are short-circuited in the high-power mode. Thus, a node between the matching circuit 6 and the matching circuit 8 is grounded via the capacitor 9. In the low-power mode, a series circuit in which the other end of the capacitor 9 and the one end of the inductor 10 are connected is formed, and the other end of the inductor 10 is grounded. Thus, the node between the matching circuit 6 and the matching circuit 8 is grounded via the series circuit of the capacitor 9 and the inductor 10.

The second path R2 includes the amplifier 4 and a matching circuit 7. The amplifier 4, which is a second amplifier, operates in the low-power mode, which is the second mode. The amplifier 4 does not operate in the high-power mode, which is the first mode. In the high-power mode, which is the first mode, no bias current is supplied to a transistor (not illustrated) in an output stage of the amplifier 4. The matching circuit 7, which is a second matching circuit, performs impedance conversion from about 15Ω to about 50Ω, for example.

The amplifiers 3 and 4 are formed in a chip of an integrated circuit, for example. The matching circuits 6, 7, and 8 are implemented by components outside the chip of the integrated circuit, for example. The short-circuit switch 11 may be formed in the chip of the integrated circuit or may be implemented by a component outside the chip of the integrated circuit.

Operation

Next, the operation of the power amplifier circuit 1 according to the first embodiment will be described. The operation of the power amplifier circuit 1 according to the first embodiment includes an operation in the high-power mode, which is the first mode, and an operation in the low-power mode, which is the second mode. In the high-power mode, the amplifier 3 operates. In the low-power mode, the amplifier 4 operates.

Figure 4:
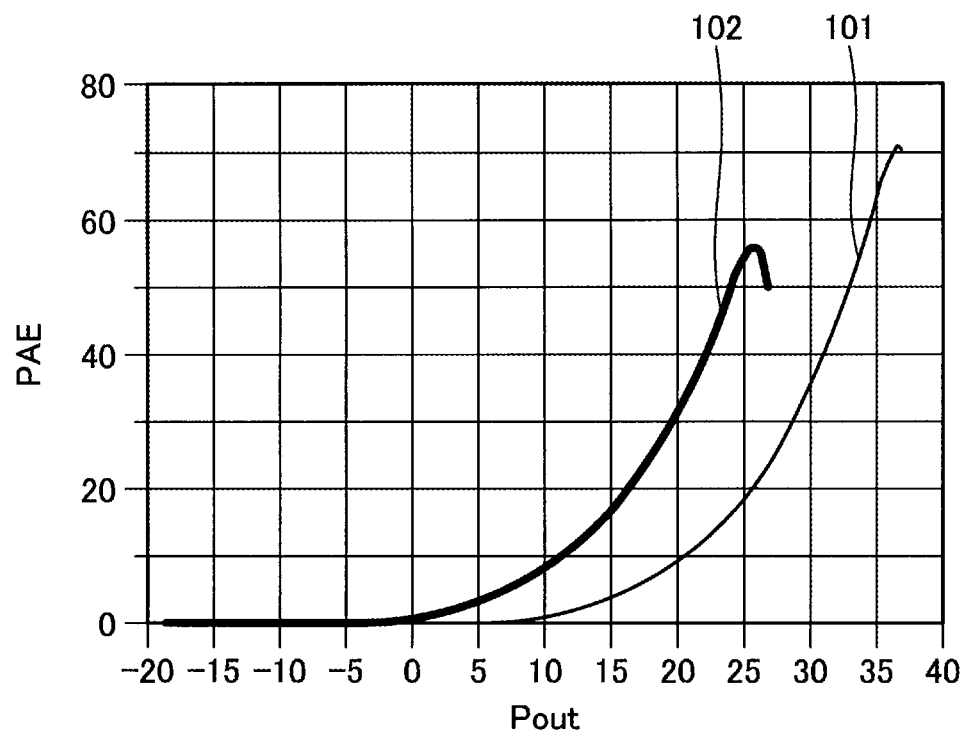
FIG. 4 illustrates a relationship between the signal intensity of an output signal of the power amplifier circuit and the power-added efficiency of the power amplifier circuit.

FIG. 4 illustrates a relationship between the signal intensity (dBm) of the power Pout of an output signal of the power amplifier circuit 1 and the power-added efficiency (PAE) of the power amplifier circuit 1. FIG. 4 illustrates an example simulation result when the operating frequencies of the amplifier 3 and the amplifier 4 are set to 2550 MHz and a power supply voltage Vcc is set to 5.5 V.

In FIG. 4, line 101 indicates the relationship between the power Pout of the output signal of the power amplifier circuit 1 according to the first embodiment and the power-added efficiency PAE in the high-power mode, which is the first mode. Line 102 indicates the relationship between the power Pout of the output signal of the power amplifier circuit 1 according to the first embodiment and the power-added efficiency PAE in the low-power mode, which is the second mode.

The following describes the operation of the power amplifier circuit 1. The operation of the power amplifier circuit 1 in the high-power mode, which is the first mode, and the operation of the power amplifier circuit 1 in the low-power mode, which is the second mode, will be described separately.

Operation in First Mode

Figure 5:
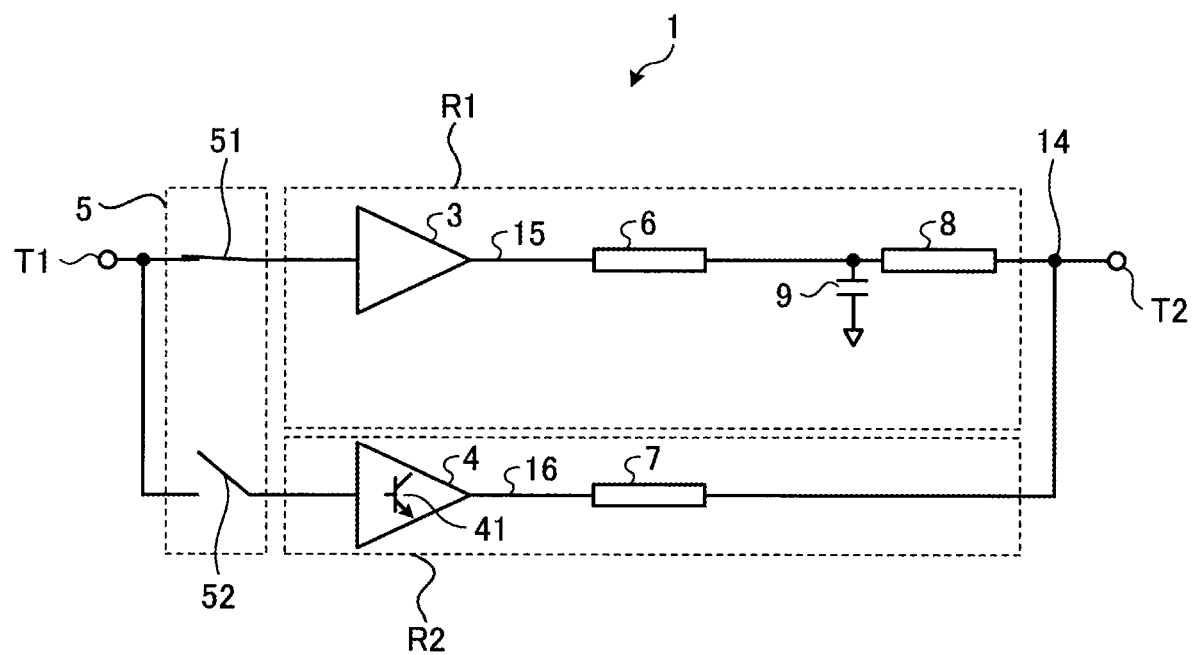
FIG. 5 illustrates the state of a switching unit and so on in a first mode.

FIG. 5 illustrates the state of the switching unit 5 and so on in the first mode. As illustrated in FIG. 5, in the high-power mode, which is the first mode, the switch 51 of the switching unit 5 is in the on position, and the switch 52 of the switching unit 5 is in the off position. As described above, in the high-power mode, both ends of the inductor 10 are short-circuited by the short-circuit switch 11. As a result, the node between the matching circuit 6 and the matching circuit 8 is grounded via the capacitor 9. In the high-power mode, a bias current is supplied to the amplifier 3, whereas no bias current is supplied to the amplifier 4. Accordingly, for example, parasitic capacitances between the collector and emitter and between the collector and base of a transistor 41 in the output stage of the amplifier 4 are seen at an output end 16.

Figure 6:
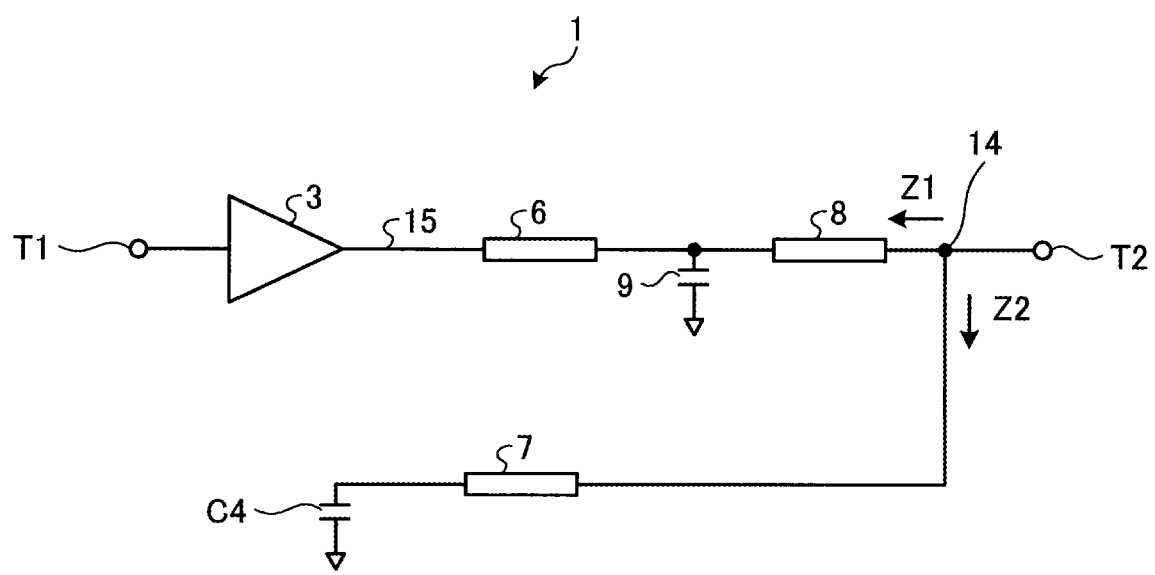
FIG. 6 illustrates an equivalent circuit of the power amplifier circuit in the first mode.

FIG. 6 illustrates an equivalent circuit of the power amplifier circuit 1 in the first mode. In the high-power mode, which is the first mode, in the power amplifier circuit 1, since the switch 51 of the switching unit 5 is in the on position, the input terminal T1 is connected to the amplifier 3. In the high-power mode, no bias current is supplied to the transistor in the output stage of the amplifier 4. Thus, the parasitic capacitances of the amplifier 4 are seen as a capacitor C4. Accordingly, the amplifier 4, which is the second amplifier, serves as a capacitive load.

Figure 7:
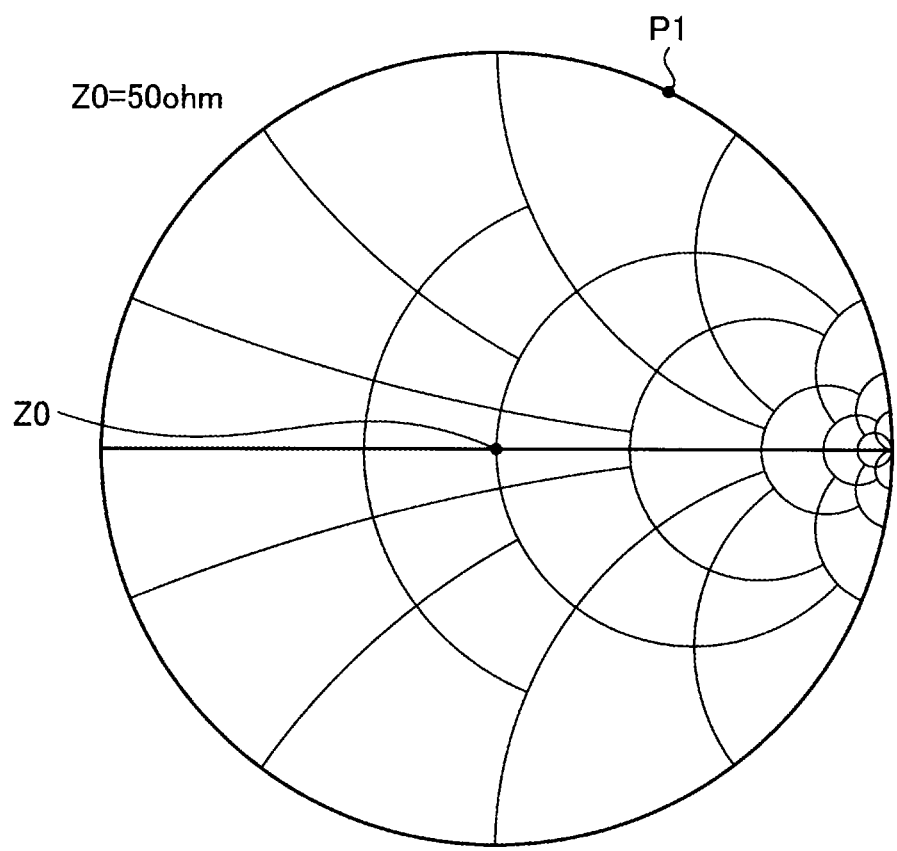
FIG. 7 is a Smith chart of the output load impedance of the power amplifier circuit.

FIG. 7 is a Smith chart of the output load impedance of the power amplifier circuit 1. FIG. 7 is a Smith chart illustrating a simulation result of an impedance Z2 along the second path when the amplifier 4 side is seen from the node 14 between the matching circuit 8 and the output terminal T2 in FIG. 6. In FIG. 7, a transmission path characteristic impedance Z0 is set to 50Ω, and the impedance Z2 is represented by a point P1. In FIG. 7, the point P1 is located on the outer perimeter of the Smith chart. This indicates that the impedance Z2 is sufficiently high. Accordingly, the impedance Z2 can be set to a sufficiently higher value than that of the impedance on the output terminal T2 side as seen from the node 14, that is, the load impedance connected to the output terminal T2. Since the impedance Z2 has a sufficiently higher value than the load impedance connected to the output terminal T2, the amplifier 4 side relative to the node 14 can be regarded as being open. In the high-power mode, accordingly, the second path R2 does not affect the impedance on the output terminal T2 side as seen from an output end 15 of the amplifier 3.

Operation in Second Mode

Figure 8:
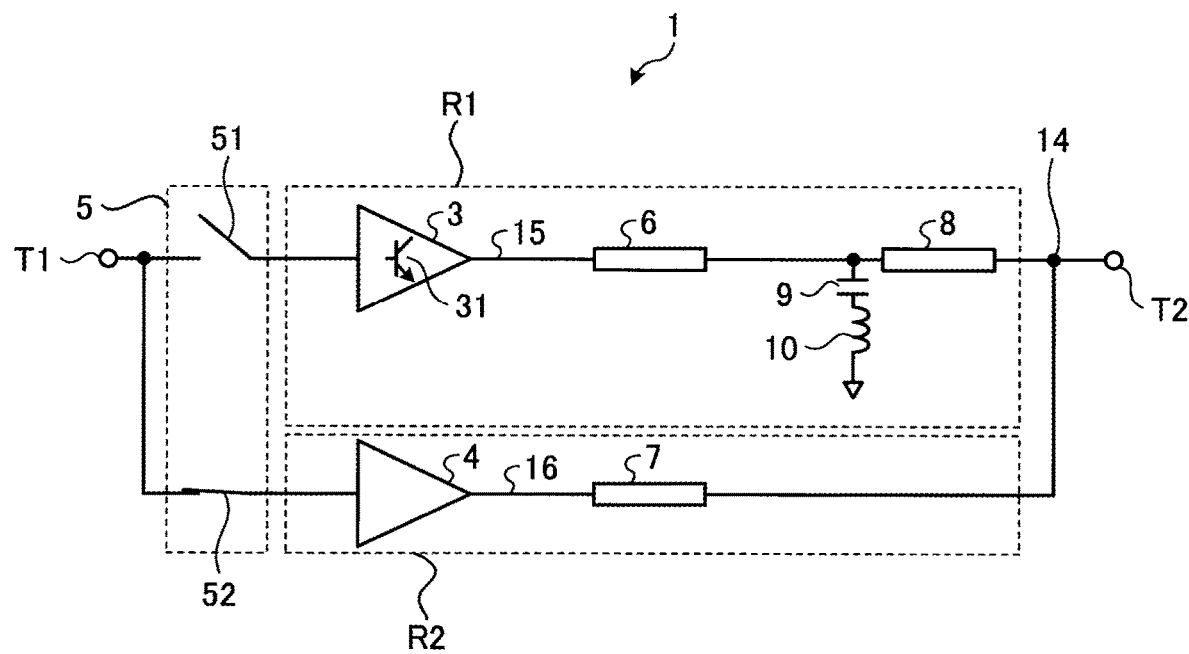
FIG. 8 illustrates the state of the switching unit and so on in a second mode.

FIG. 8 illustrates the state of the switching unit 5 and so on in the second mode. As illustrated in FIG. 8, in the low-power mode, which is the second mode, the switch 51 of the switching unit 5 is in the off position, and the switch 52 of the switching unit 5 is in the on position. As described above, in the low-power mode, both ends of the inductor 10 are not short-circuited by the short-circuit switch 11. As a result, the node between the matching circuit 6 and the matching circuit 8 is grounded via the series circuit of the capacitor 9 and the inductor 10. In the low-power mode, a bias current is supplied to the amplifier 4, whereas no bias current is supplied to the amplifier 3. Accordingly, for example, parasitic capacitances between the collector and emitter and between the collector and base of a transistor 31 in the output stage of the amplifier 3 are seen from the output end 16.

Figure 9:
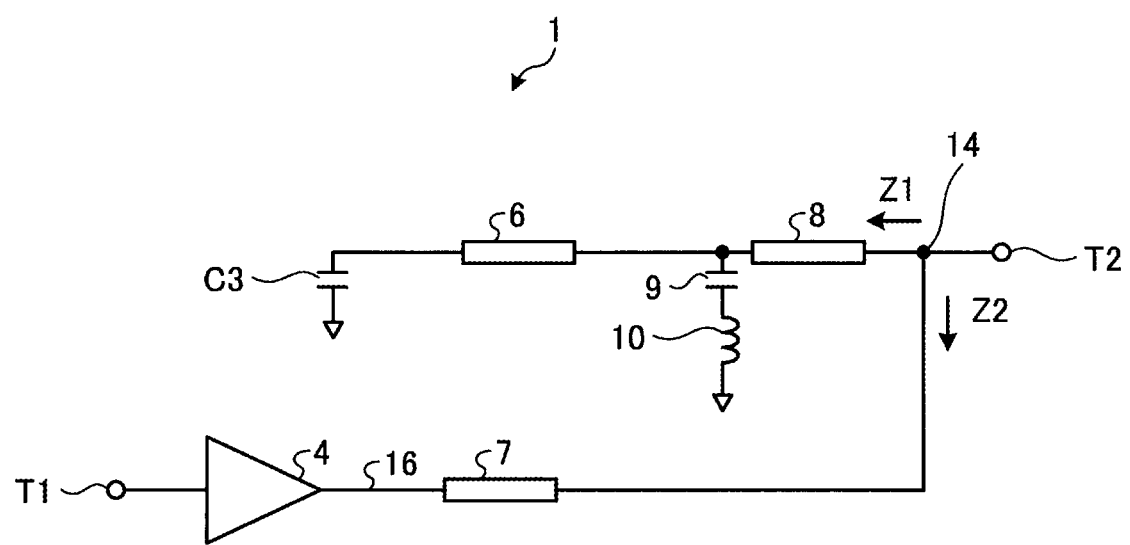
FIG. 9 illustrates an equivalent circuit of the power amplifier circuit in the second mode.

FIG. 9 illustrates an equivalent circuit of the power amplifier circuit 1 in the second mode. In the low-power mode, which is the second mode, in the power amplifier circuit 1, since the switch 52 of the switching unit 5 is in the on position, the input terminal T1 is connected to the amplifier 4. In the low-power mode, no bias current is supplied to the transistor in the output stage of the amplifier 3. Thus, the parasitic capacitances of the amplifier 3 are seen as a capacitor C3. Accordingly, the amplifier 3, which is the first amplifier, serves as a capacitive load. The transistor in the output stage of the amplifier 3, which operates in the high-power mode, has a larger area than the transistor in the output stage of the amplifier 4, which operates in the low-power mode. The capacitor C3 illustrated in FIG. 9 has thus a larger capacitance value than the capacitor C4 illustrated in FIG. 6.

Figure 10:
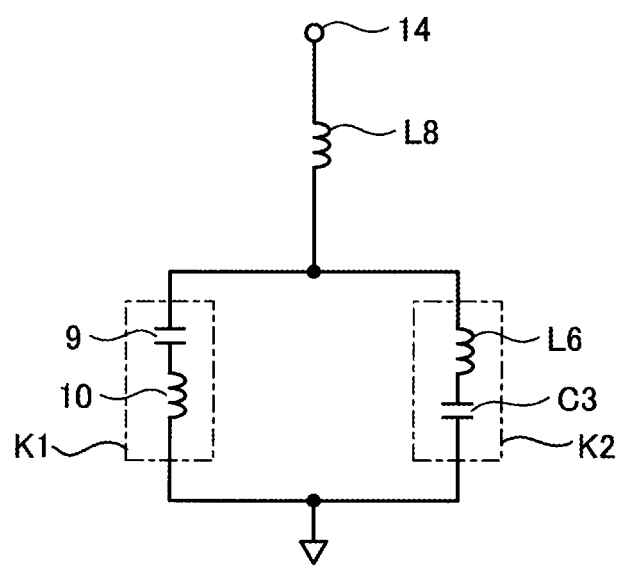
FIG. 10 illustrates an equivalent circuit of a circuit on the amplifier side seen from a node between a matching circuit and an output terminal.

The amplifier 3 side seen from the node 14 between the matching circuit 8 and the output terminal T2 in FIG. 9 is illustrated in FIG. 10. When the matching circuit 6 and the matching circuit 8 are configured as lines, the lines approximately act as inductors. Thus, in FIG. 10, the matching circuit 6 and the matching circuit 8 are represented by an inductor L6 and an inductor L8, respectively. FIG. 10 illustrates an equivalent circuit of a circuit on the amplifier 3 side seen from the node 14 between the matching circuit 8 and the output terminal T2. As illustrated in FIG. 10, when the amplifier 3 side is seen from the node 14, the matching circuit 8 is seen to be connected to a parallel connection of a series circuit of the capacitor 9 and the inductor 10 and a series circuit of the inductor L6 and the capacitor C3. An end of the inductor 10 and an end of the capacitor C3 are grounded. The inductor L8 is an inductive component of the matching circuit 8. The inductor L6 is an inductive component of the matching circuit 6.

Inductance values and capacitance values are set so that at a frequency at which the amplifier 4 is configured to operate, the circuit illustrated in FIG. 10 resonates to make the value of an impedance Z1 infinite or sufficiently higher than the value of the load impedance connected to the output terminal T2. That is, the inductance values of the inductor 10 and the inductor L6 and the capacitance values of the capacitor 9 and the capacitor C3 are set. The term "frequency at which an amplifier is configured to operate", as used herein, is defined as a frequency range over which the gain of the amplifier is greater than or equal to about 10 dB.

The inductance values and the capacitance values are set with consideration given to the following, for example. In the circuit illustrated in FIG. 10, the inductor 10 and the capacitor 9 form a series resonant circuit K1. The resonant frequency of the series resonant circuit K1 is set to a sufficiently low value. For example, the resonant frequency is set to a value lower than a frequency at which the amplifier 3 is configured to operate. Accordingly, a series resonant circuit formed by the inductance of the inductor 10 and the capacitance of the capacitor 9 is an inductive circuit in which the inductance value of the inductor 10 is dominant over a frequency range higher than the resonant frequency. The inductor L6 and the capacitor C3 form a series resonant circuit K2. The resonant frequency of the series resonant circuit K2 is set to a sufficiently high value. For example, the resonant frequency is set to a value higher than a frequency at which the amplifier 3 is configured to operate. Accordingly, a series resonant circuit formed by the inductance of the inductor L6 and the capacitance of the capacitor C3 is a capacitive circuit in which the capacitance value of the capacitor C3 is dominant over a frequency range lower than the resonant frequency. In FIG. 10, a parallel resonant circuit in which the inductive series resonant circuit K1 and the capacitive series resonant circuit K2 are connected in parallel is formed, and the impedance of the parallel resonant circuit becomes infinite at the resonant frequency of the parallel resonant circuit.

Figure 11:
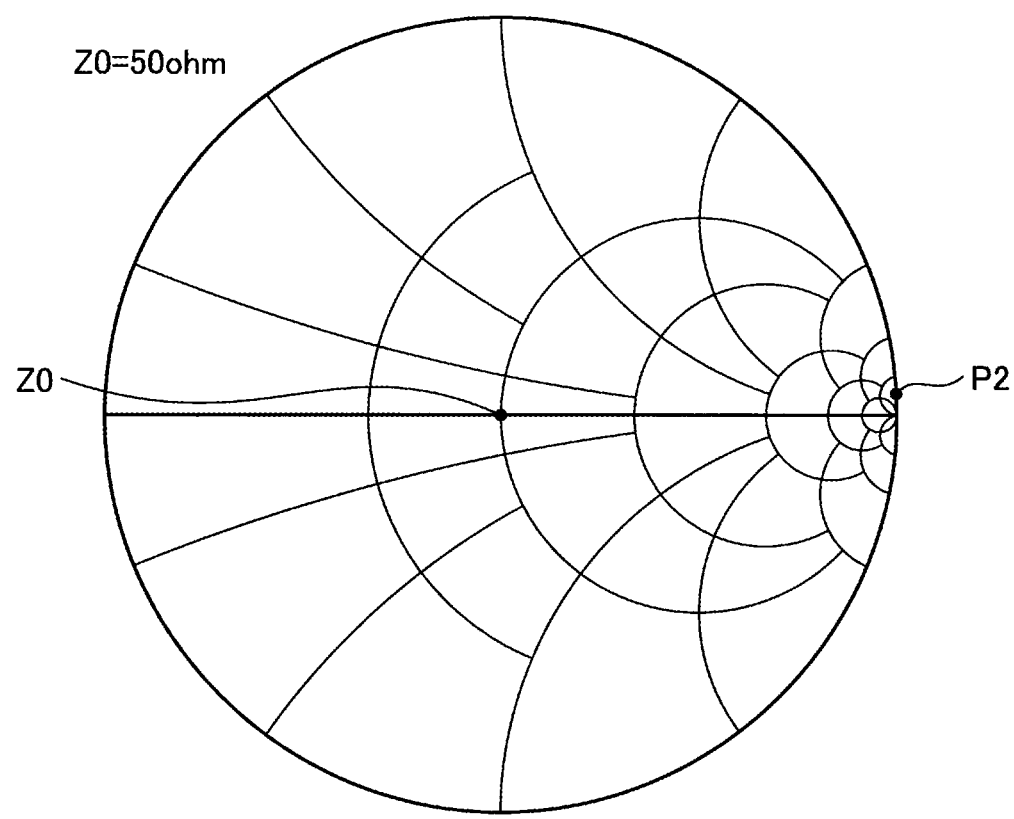
FIG. 11 is a Smith chart of the output load impedance of the power amplifier circuit.

FIG. 11 is a Smith chart of the output load impedance of the power amplifier circuit 1. FIG. 11 is a Smith chart illustrating a simulation result of the impedance Z1 in the first path when the amplifier 3 side is seen from the node 14 between the matching circuit 8 and the output terminal T2 in FIG. 9. In FIG. 11, a transmission path characteristic impedance Z0 is set to 50Ω, and the impedance Z1 is represented by a point P2. In FIG. 11, the point P2 is near infinity. Accordingly, for example, the capacitance value of the capacitor 9 and the inductance value of the inductor 10 are set to appropriate values, thereby setting the value of the impedance Z1 in the circuit illustrated in FIG. 10 to infinite or to a sufficiently higher value than the value of the impedance on the output terminal T2 side as seen from the node 14, that is, the value of the load impedance connected to the output terminal T2, at a frequency at which the amplifier 4 is configured to operate. Since the impedance Z1 is set to infinite or to a sufficiently higher value than the value of the load impedance connected to the output terminal T2, the amplifier 3 side relative to the node 14 can be regarded as being open. In the low-power mode, therefore, the first path R1 does not affect the impedance on the output terminal T2 side as seen from the output end 16 of the amplifier 4. Thus, isolation can be ensured between the first path R1 and the second path R2. In addition, unlike the comparative example, because of no use of a circuit configuration in which the impedance is decreased and is then increased, power loss, which is generated in the comparative example, is not generated.

The operation described above can reduce power loss in both the first mode and the second mode while ensuring isolation between the first path R1 and the second path R2.

Second Embodiment

Circuit Configuration

Figure 12:
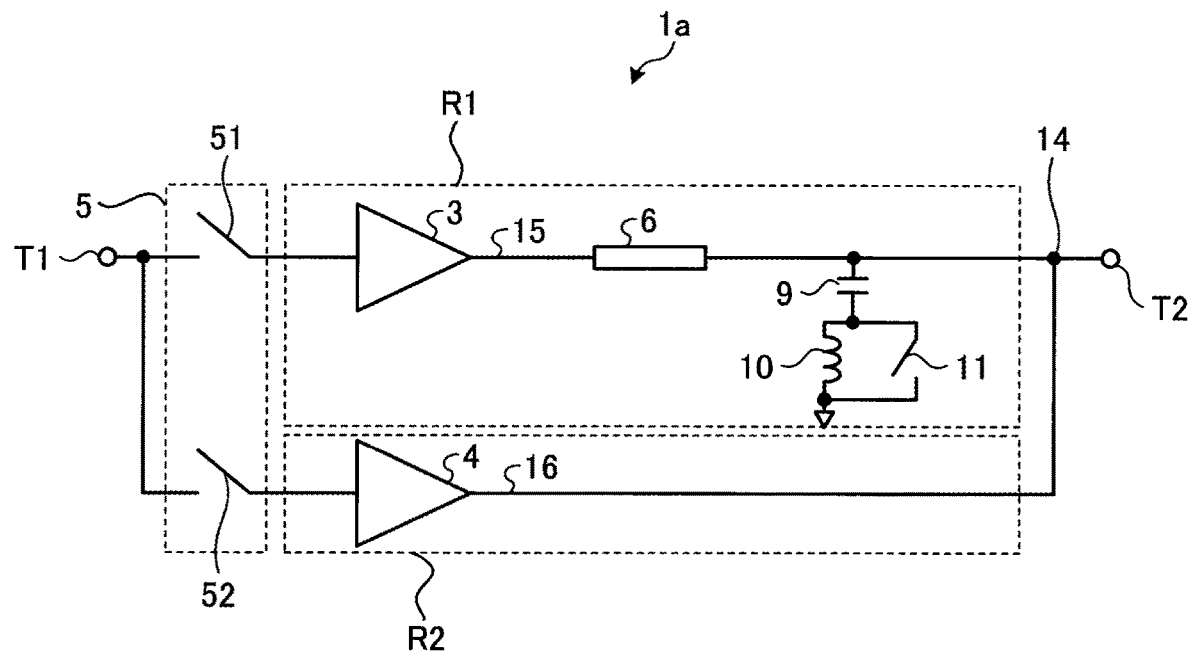
FIG. 12 illustrates a circuit configuration of a power amplifier circuit according to a second embodiment.

FIG. 12 illustrates a circuit configuration of a power amplifier circuit 1a according to the second embodiment. Unlike the power amplifier circuit 1 illustrated in FIG. 3, the power amplifier circuit 1a does not include the matching circuit 7 or the matching circuit 8. Since the power amplifier circuit 1a includes fewer matching circuits than the power amplifier circuit 1 illustrated in FIG. 3, the reduction in the number of components included can reduce cost.

Operation

Next, the operation of the power amplifier circuit 1a according to the second embodiment will be described.

Operation in First Mode

Figure 13:
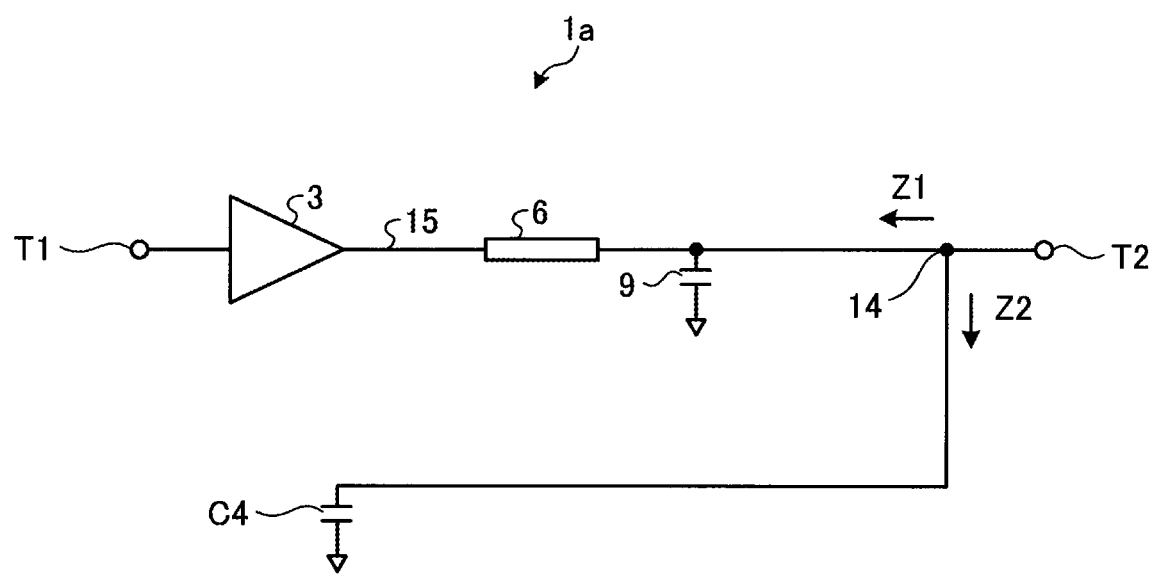
FIG. 13 illustrates an equivalent circuit of the power amplifier circuit in the first mode.

FIG. 13 illustrates an equivalent circuit of the power amplifier circuit 1a in the first mode. In the high-power mode, which is the first mode, in the power amplifier circuit 1a, since the switch 51 of the switching unit 5 is in the on position, the input terminal T1 is connected to the amplifier 3. In the high-power mode, no bias current is supplied to a transistor in the output stage of the amplifier 4. Thus, the parasitic capacitances of the amplifier 4 are seen as a capacitor C4.

As in FIG. 6, the impedance Z2 on the capacitor C4 side, which corresponds to the parasitic capacitances of the amplifier 4, as seen from the node 14 is sufficiently high at a frequency at which the amplifier 3 is configured to operate. In the high-power mode, therefore, the second path R2 does not affect the impedance on the output terminal T2 side as seen from the output end 15 of the amplifier 3.

Operation in Second Mode

Figure 14:
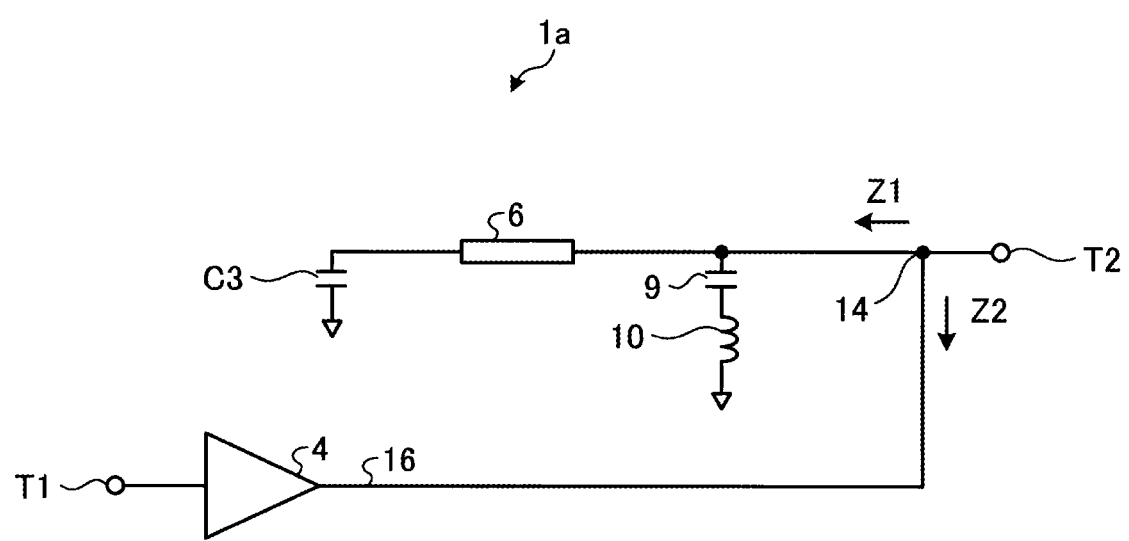
FIG. 14 illustrates an equivalent circuit of the power amplifier circuit in the second mode.

FIG. 14 illustrates an equivalent circuit of the power amplifier circuit 1a in the second mode. In the low-power mode, which is the second mode, no bias current is supplied to a transistor in the output stage of the amplifier 3. Thus, the parasitic capacitances of the amplifier 3 are seen as a capacitor C3.

As described with reference to FIGS. 9 and 10, for example, the capacitance value of the capacitor 9 and the inductance value of the inductor 10 are set to appropriate values, thereby setting the value of the impedance Z1 to infinite or to a sufficiently higher value than the load impedance connected to the output terminal T2 at a frequency at which the amplifier 4 is configured to operate. In the low-power mode, therefore, the first path R1 does not affect the impedance on the output terminal T2 side as seen from the output end 16 of the amplifier 4.

Also, in the second embodiment, the operation described above can reduce power loss in both the first mode and the second mode while ensuring isolation between the first path R1 and the second path R2.

Third Embodiment

Circuit Configuration

Figure 15:
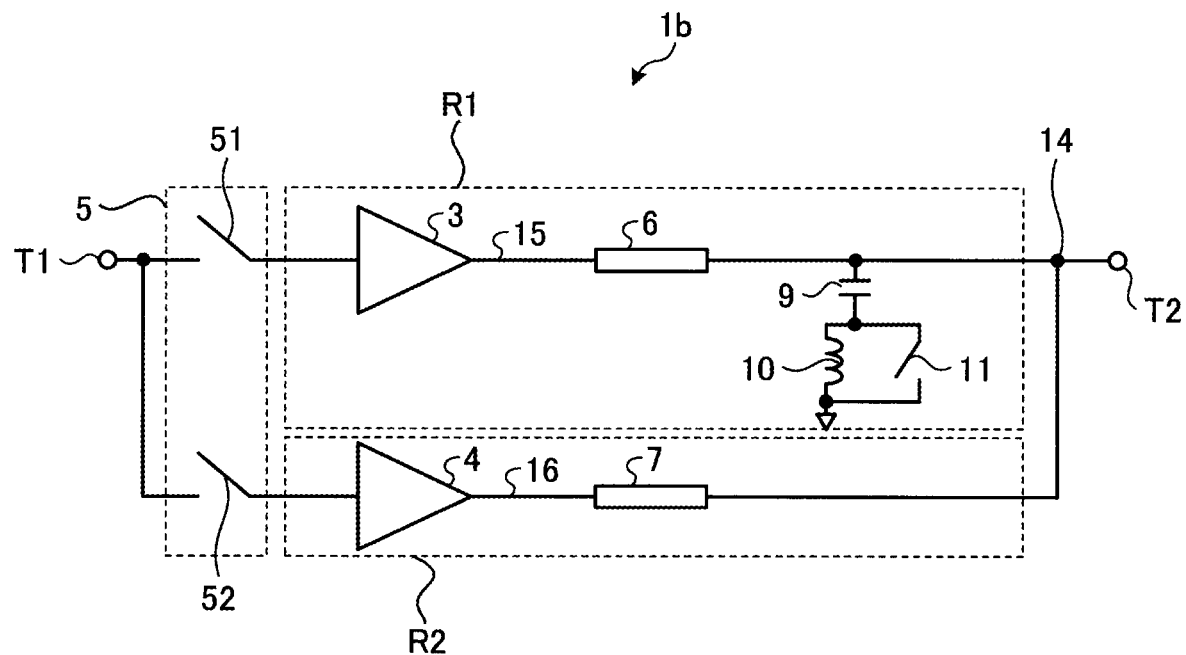
FIG. 15 illustrates a circuit configuration of a power amplifier circuit according to a third embodiment.

FIG. 15 illustrates a circuit configuration of a power amplifier circuit 1b according to a third embodiment. Unlike the power amplifier circuit 1 illustrated in FIG. 3, the power amplifier circuit 1b does not include the matching circuit 8. Since the power amplifier circuit 1b includes fewer matching circuits than the power amplifier circuit 1 illustrated in FIG. 3, the reduction in the number of components included can reduce cost.

Operation

Next, the operation of the power amplifier circuit b according to the third embodiment will be described.

Operation in First Mode

Figure 16:
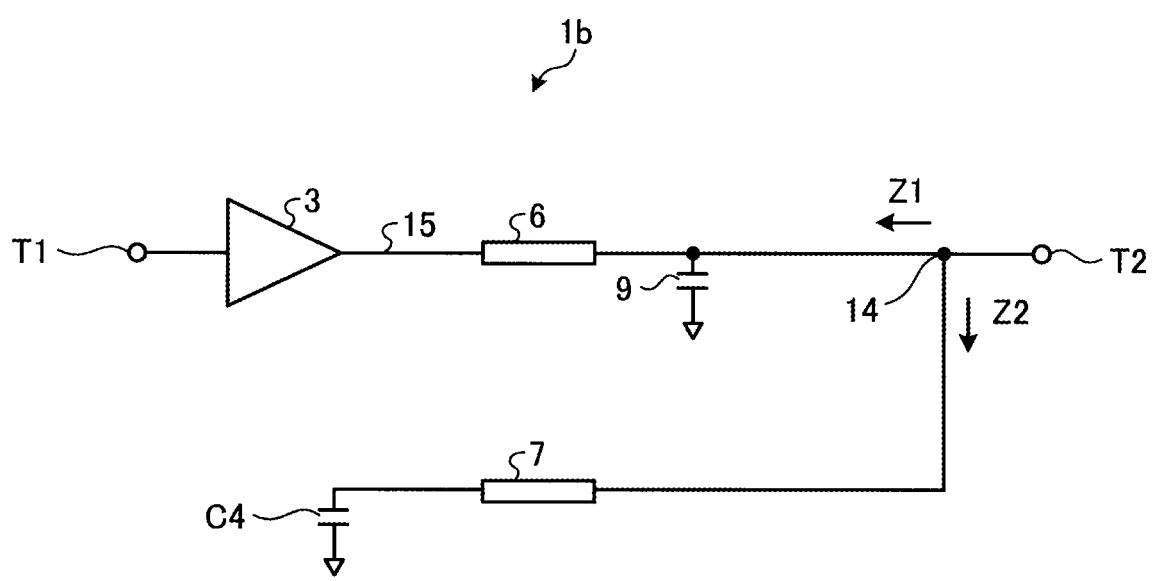
FIG. 16 illustrates an equivalent circuit of the power amplifier circuit in the first mode.

FIG. 16 illustrates an equivalent circuit of the power amplifier circuit 1b in the first mode. In the high-power mode, which is the first mode, in the power amplifier circuit 1b, since the switch 51 of the switching unit 5 is in the on position, the input terminal T1 is connected to the amplifier 3. In the high-power mode, no bias current is supplied to a transistor in the output stage of the amplifier 4. Thus, the parasitic capacitances of the amplifier 4 are seen as a capacitor C4.

As in FIG. 6, the impedance Z2 on the series circuit side, which is formed by the inductor corresponding to the matching circuit 7 and the capacitor C4 corresponding to the parasitic capacitances of the amplifier 4, as seen from the node 14 is sufficiently high at a frequency at which the amplifier 3 is configured to operate. In the high-power mode, therefore, the second path R2 does not affect the impedance on the output terminal T2 side as seen from the output end 15 of the amplifier 3.

Operation in Second Mode

Figure 17:
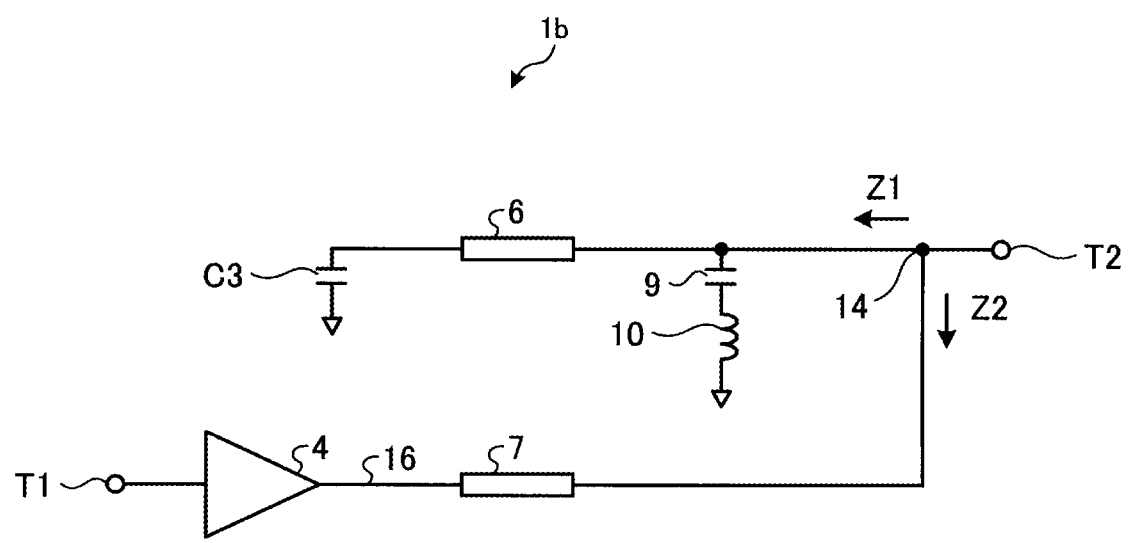
FIG. 17 illustrates an equivalent circuit of the power amplifier circuit in the second mode.

FIG. 17 illustrates an equivalent circuit of the power amplifier circuit 1b in the second mode. In the low-power mode, which is the second mode, no bias current is supplied to a transistor in the output stage of the amplifier 3. Thus, the parasitic capacitances of the amplifier 3 are seen as a capacitor C3.

As described with reference to FIGS. 9 and 10, for example, the capacitance value of the capacitor 9 and the inductance value of the inductor 10 are set to appropriate values, thereby setting the value of the impedance Z1 to infinite or to a sufficiently higher value than the load impedance connected to the output terminal T2 at a frequency at which the amplifier 4 is configured to operate. In the low-power mode, therefore, the first path R1 does not affect the impedance on the output terminal T2 side as seen from the output end 16 of the amplifier 4.

Also, in the third embodiment, the operation described above can reduce power loss in both the first mode and the second mode while ensuring isolation between the first path R1 and the second path R2.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
   an input terminal;
   an output terminal;
   a first path between the input terminal and the output terminal;

a second path between the input terminal and the output terminal, the second path being connected in parallel with the first path;

a first amplifier in the first path, the first amplifier being operative when the power amplifier circuit is in a first mode;

a second amplifier in the second path, the second amplifier being operative when the power amplifier circuit is in a second mode;

a first matching circuit in the first path, the first matching circuit being located between the first amplifier and the output terminal;

a first capacitor, the first capacitor having a first end and a second end, the first end of the first capacitor being connected to the first path between the first matching circuit and the output terminal;

a first inductor having a first end connected to the second end of the first capacitor and a second end that is grounded; and a short-circuit switch connected in parallel with the first inductor, wherein the short-circuit switch is configured to be in a short-circuit state when the power amplifier circuit is in the first mode, such that the first and second ends of the first inductor are short-circuited in the short-circuited state, and is configured to be in an open-circuit state when the power amplifier circuit is in the second mode.

2. The power amplifier circuit according to claim 1, further comprising:

a second matching circuit in the second path, the second matching circuit being located between the second amplifier and the output terminal.

3. The power amplifier circuit according to claim 1, further comprising:

a third matching circuit in the first path, the third matching circuit being located between the first end of the first capacitor and the output terminal.

4. The power amplifier circuit according to claim 1, further comprising:

a second matching circuit in the second path, the second matching circuit being located between the second amplifier and the output terminal; and a third matching circuit in the first path, the third matching circuit being located between the first end of the first capacitor and the output terminal.

5. The power amplifier circuit according to claim 1, further comprising a switch circuit, the switch circuit comprising:

a first switch between the input terminal and the first amplifier, and a second switch between the input terminal and the second amplifier, wherein:

the first switch is configured to be in an on state when the power amplifier circuit is in the first mode, such that the input terminal is electrically connected to the first amplifier, and is configured to be in an off state when the power amplifier circuit is in the second mode, such that the input terminal is electrically disconnected from the first amplifier, and the second switch is configured to be in an on state when the power amplifier circuit is in the second mode, such that the input terminal is electrically connected to the second amplifier, and is configured to be in an off state when the power amplifier circuit is in the first mode, such that the input terminal is electrically disconnected from the second amplifier.

6. The power amplifier circuit according to claim 2, further comprising a switch circuit, the switch circuit comprising:

a first switch between the input terminal and the first amplifier, and a second switch between the input terminal and the second amplifier, wherein:

the first switch is configured to be in an on state when the power amplifier circuit is in the first mode, such that the input terminal is electrically connected to the first amplifier, and is configured to be in an off state when the power amplifier circuit is in the second mode, such that the input terminal is electrically disconnected from the first amplifier, and the second switch is configured to be in an on state when the power amplifier circuit is in the second mode, such that the input terminal is electrically connected to the second amplifier, and is configured to be in an off state when the power amplifier circuit is in the first mode, such that the input terminal is electrically disconnected from the second amplifier.

7. The power amplifier circuit according to claim 3, further comprising a switch circuit, the switch circuit comprising:

a first switch between the input terminal and the first amplifier, and a second switch between the input terminal and the second amplifier, wherein:

the first switch is configured to be in an on state when the power amplifier circuit is in the first mode, such that the input terminal is electrically connected to the first amplifier, and is configured to be in an off state when the power amplifier circuit is in the second mode, such that the input terminal is electrically disconnected from the first amplifier, and the second switch is configured to be in an on state when the power amplifier circuit is in the second mode, such that the input terminal is electrically connected to the second amplifier, and is configured to be in an off state when the power amplifier circuit is in the first mode, such that the input terminal is electrically disconnected from the second amplifier.

8. The power amplifier circuit according to claim 1, wherein the first path has a greater gain than the second path.

9. The power amplifier circuit according to claim 2, wherein the first path has a greater gain than the second path.

10. The power amplifier circuit according to claim 3, wherein the first path has a greater gain than the second path.

11. The power amplifier circuit according to claim 4, wherein the first path has a greater gain than the second path.

12. The power amplifier circuit according to claim 1, wherein:

when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and when the power amplifier circuit is in the second mode, the first amplifier has a capacitive load, and an impedance in the first path as seen from the node is greater than an impedance as seen from the node at a frequency at which the second amplifier is configured to operate.

13. The power amplifier circuit according to claim 12, wherein the first inductor has an inductance value such that that when the power amplifier circuit is in the second mode, the impedance in the first path as seen from the node is high relative to the impedance in the second path.

14. The power amplifier circuit according to claim 12, wherein when the power amplifier circuit is in the first mode, the impedance in the second path as seen from the node is high relative to the impedance in the first path.

15. The power amplifier circuit according to claim 2, wherein:
when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and
when the power amplifier circuit is in the second mode, the first amplifier has a capacitive load, and an impedance in the first path as seen from the node is greater than an impedance as seen from the node at a frequency at which the second amplifier is configured to operate.

16. The power amplifier circuit according to claim 3, wherein:
when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and
when the power amplifier circuit is in the second mode, the first amplifier has a capacitive load, and an impedance in the first path as seen from the node is greater than an impedance as seen from the node at a frequency at which the second amplifier is configured to operate.

17. The power amplifier circuit according to claim 4, wherein:
when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and
when the power amplifier circuit is in the second mode, the first amplifier has a capacitive load, and an impedance in the first path as seen from the node is greater than an impedance as seen from the node at a frequency at which the second amplifier is configured to operate.

18. The power amplifier circuit according to claim 5, wherein:
when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and
when the power amplifier circuit is in the second mode, the first amplifier has a capacitive load, and an impedance in the first path as seen from the node is greater than an impedance as seen from the node at a frequency at which the second amplifier is configured to operate.

19. The power amplifier circuit according to claim 6, wherein:
when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and
when the power amplifier circuit is in the second mode, the first amplifier has a capacitive load, and an impedance in the first path as seen from the node is greater than an impedance as seen from the node at a frequency at which the second amplifier is configured to operate.

20. The power amplifier circuit according to claim 7, wherein:
when the power amplifier circuit is in the first mode, the second amplifier has a capacitive load, and an impedance in the second path as seen from a node between the output terminal and the first and second amplifiers is greater than an impedance as seen from the node at a frequency at which the first amplifier is configured to operate, and
when the power amplifier circuit is in the second mode, the first amplifier has a capacitive load, and an impedance in the first path as seen from the node is greater than an impedance as seen from the node at a frequency at which the second amplifier is configured to operate.

* * * * *

UNITED STATES PATENT AND TRADEMARK OFFICE
CERTIFICATE OF CORRECTION

| | | |
|---|---|---|
| PATENT NO. | : 11,309,842 B2 | Page 1 of 1 |
| APPLICATION NO. | : 17/017184 | |
| DATED | : April 19, 2022 | |
| INVENTOR(S) | : Honda et al. | |

It is certified that error appears in the above-identified patent and that said Letters Patent is hereby corrected as shown below:

In the Specification

Column 10, Line 10, "b" should be -- 1b --.

Signed and Sealed this
Seventh Day of February, 2023

Katherine Kelly Vidal
*Director of the United States Patent and Trademark Office*